(12) United States Patent
Hite

(10) Patent No.: US 12,525,935 B2
(45) Date of Patent: Jan. 13, 2026

(54) DUAL MODE RF-IF AMP

(71) Applicant: Bradford Thomas Hite, Valencia, CA (US)

(72) Inventor: Bradford Thomas Hite, Valencia, CA (US)

( * ) Notice: Subject to any disclaimer, the term of this patent is extended or adjusted under 35 U.S.C. 154(b) by 471 days.

(21) Appl. No.: 18/190,101

(22) Filed: Mar. 26, 2023

(65) Prior Publication Data

US 2024/0322769 A1    Sep. 26, 2024

(51) Int. Cl.
*H03F 3/45* (2006.01)
*H03F 1/02* (2006.01)
*H03F 3/24* (2006.01)

(52) U.S. Cl.
CPC ........... *H03F 3/245* (2013.01); *H03F 1/0277* (2013.01); *H03F 2200/294* (2013.01); *H03F 2200/451* (2013.01)

(58) Field of Classification Search
CPC ........................................................ H03F 3/45
USPC ................................................. 330/260, 252
See application file for complete search history.

*Primary Examiner* — Henry Choe

(57) ABSTRACT

A unique low power dual mode amplifier system for a receiver front end or transmitter is described. The invention is configured to utilize a common gain block element for amplification of both the RF-IF signal components found within a super heterodyne receiver. Replacement of separate gain stages for RF and IF components by a single common gain block offers a substantial power consumption reduction for a receiver or transmitter design. Implementation of the invention is possible using commonly found well known RF or IF circuitry elements. The invention combines several of the basic functions necessary to build a receiver or transmitter including frequency band selection, signal amplification and frequency conversion into a simple topology. An integrated circuit and discrete component type example implementations are provided.

11 Claims, 7 Drawing Sheets

Integrated Circuit Example Circuit

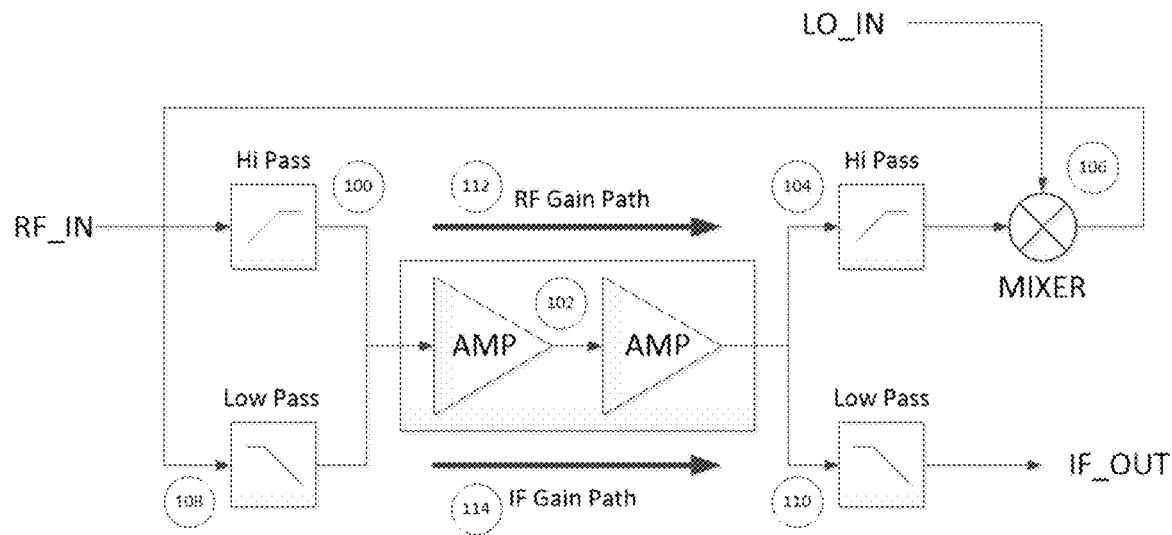
FIG 1 – System Block Diagram
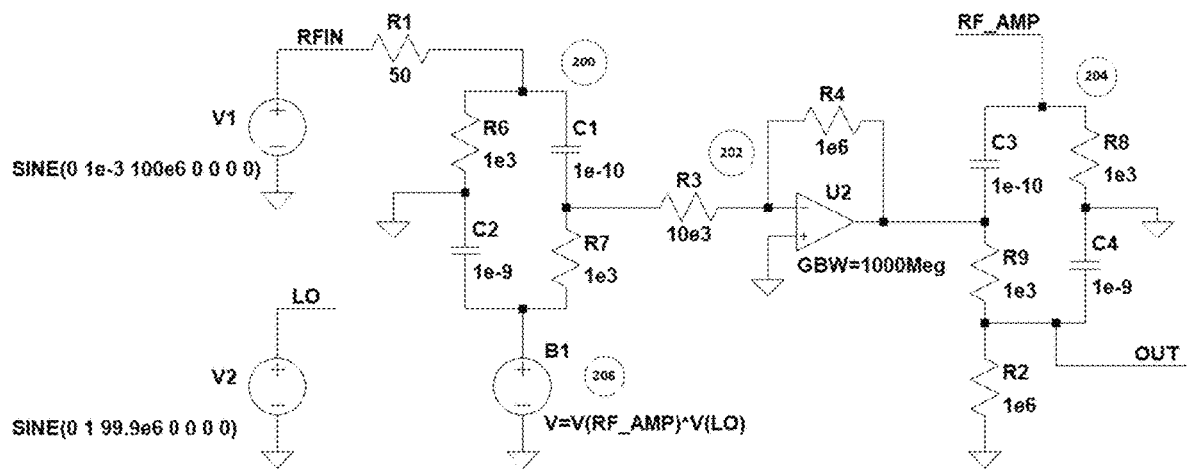
FIG 2 – Integrated Circuit Example Circuit

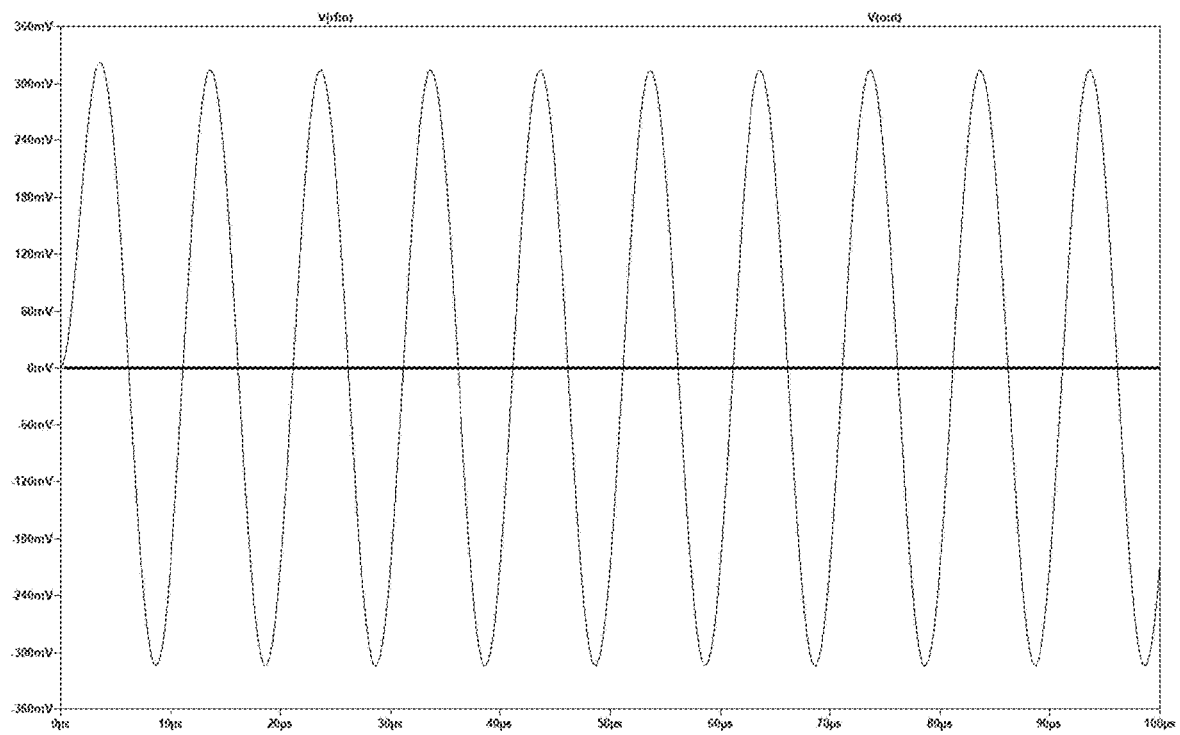
FIG 3 – Integrated Circuit Time Domain Operation
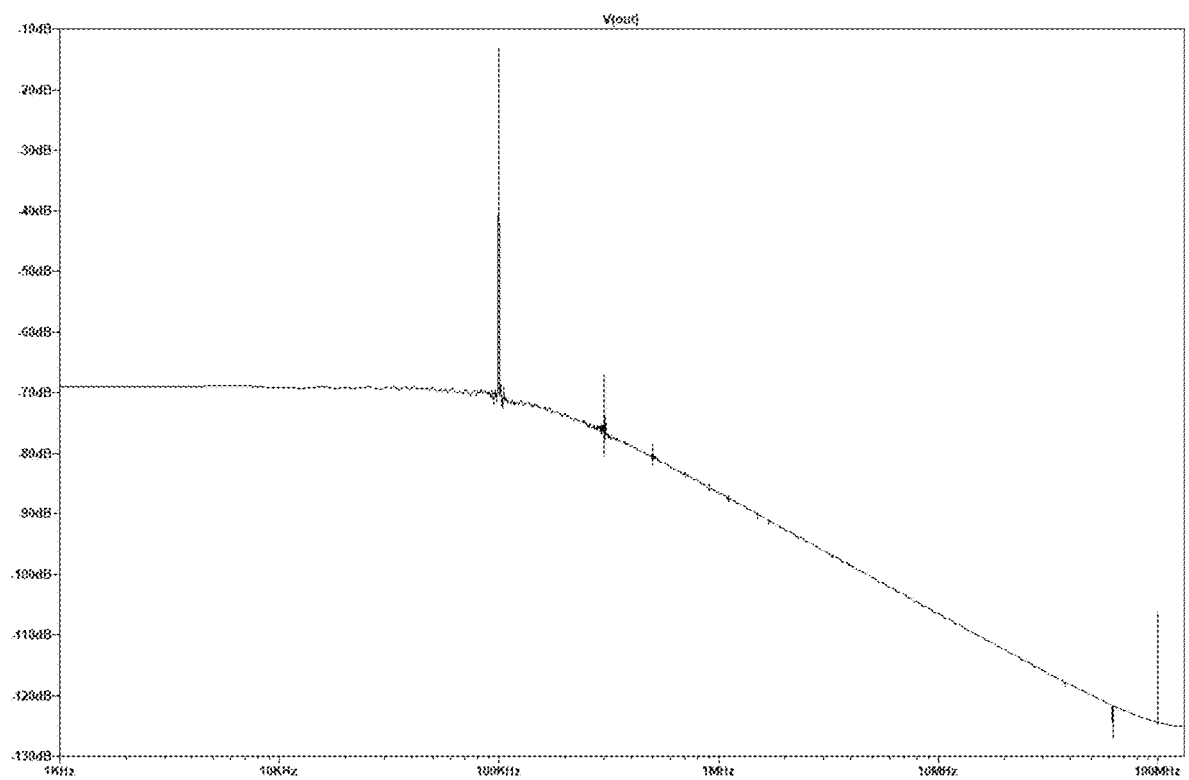
FIG 4 – Integrated Circuit Frequency Domain Operation

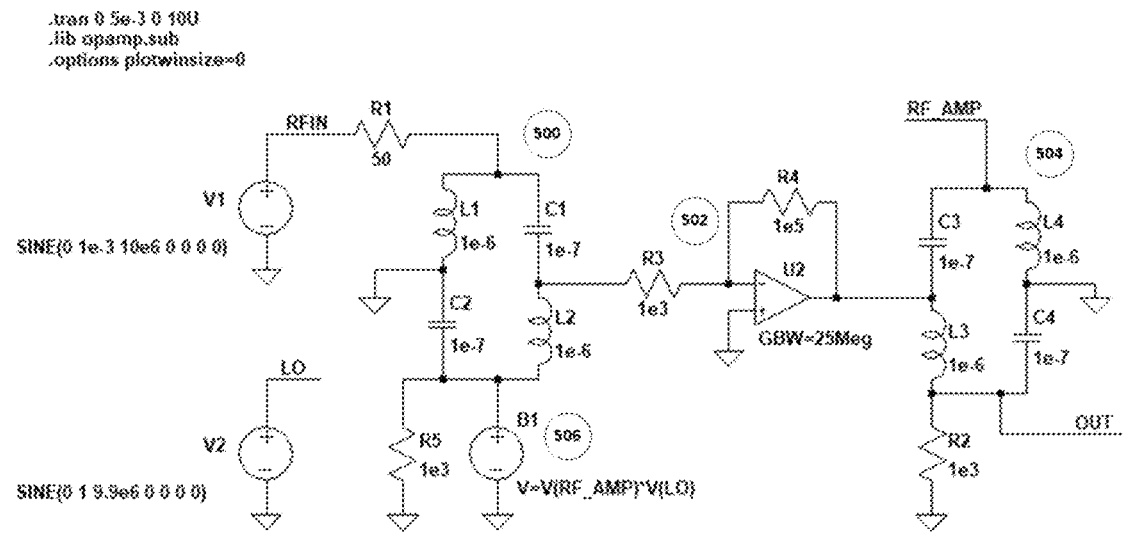
FIG 5 – Discrete Example Circuit
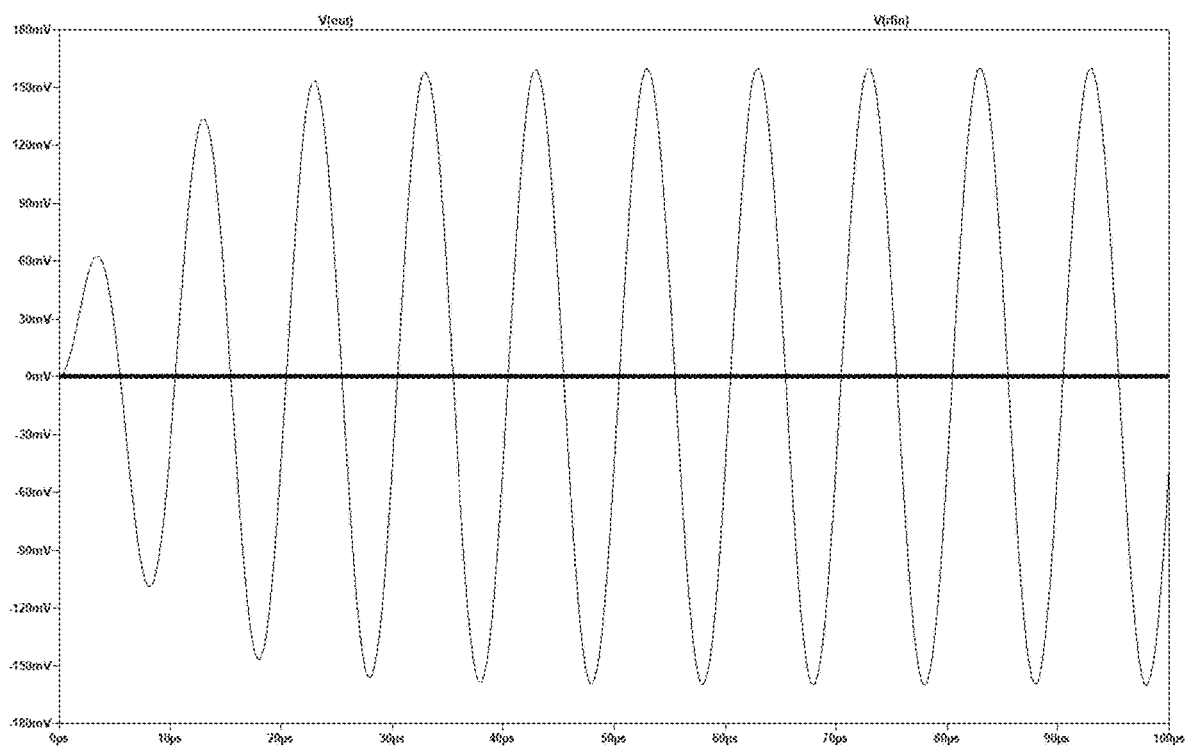
FIG 6 – Discrete Circuit Time Domain Operation

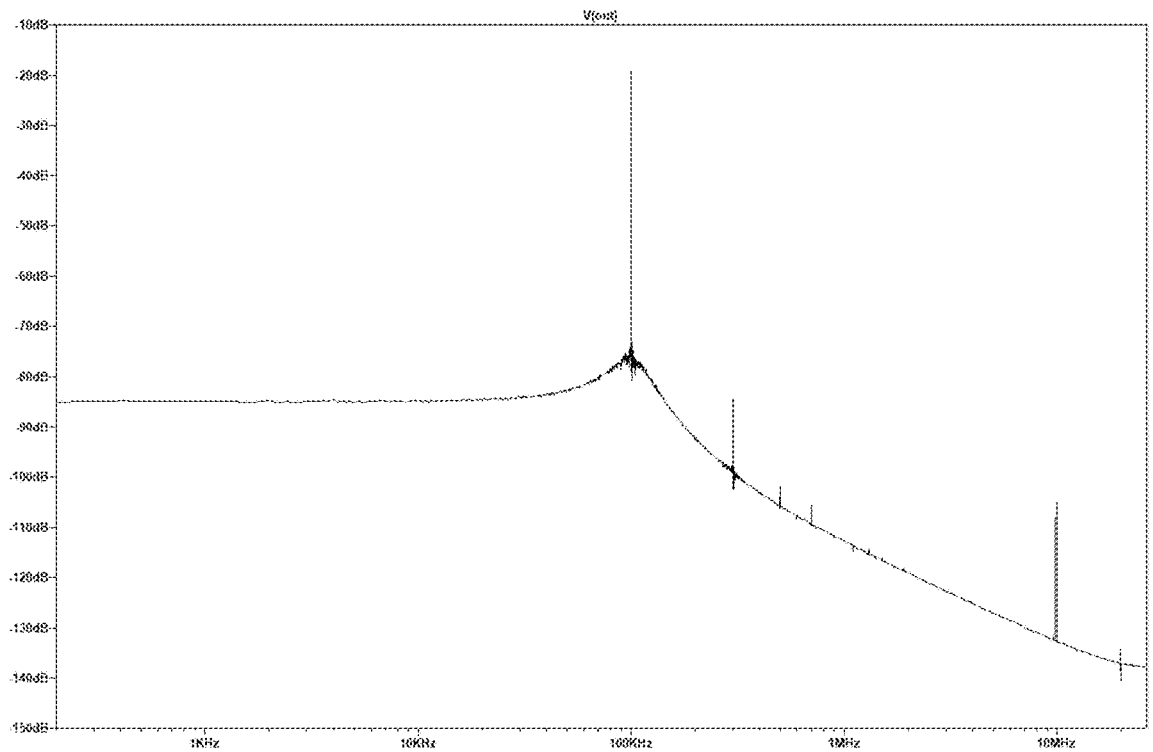
FIG 7 – Discrete Circuit Frequency Domain Operation
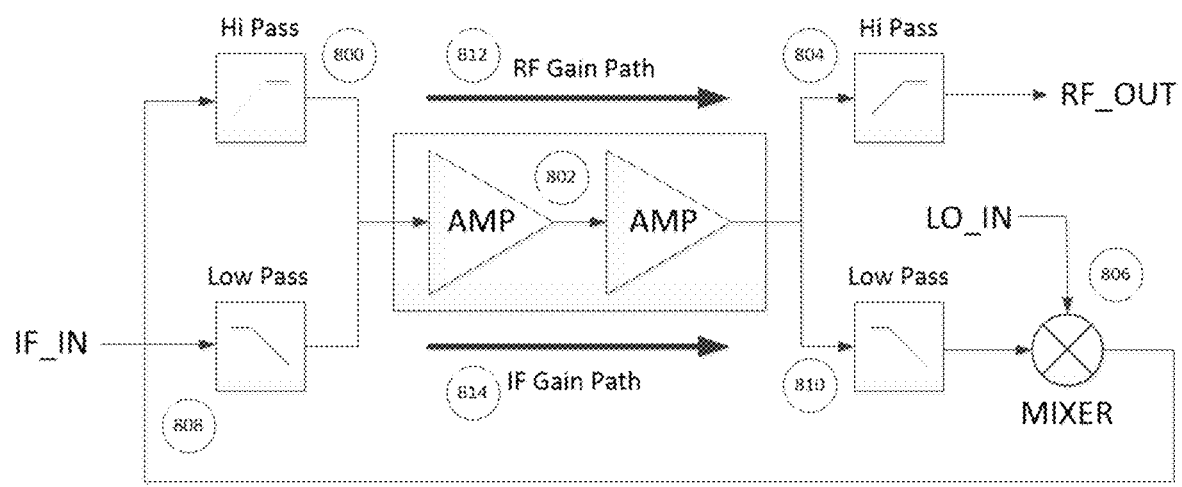
FIG 8 – Transmitter Block Diagram

LTC6253-7
2GHz, 3.5mA Gain of 7 Stable Rail-to-Rail I/O Dual Op Amp

FEATURES

- Gain Bandwidth Product: 2GHz
- –3dB Frequency ($A_V = 7$): 160MHz
- Low Quiescent Current: 3.5mA Max
- High Slew Rate: 500V/µs
- Input Common Mode Range Includes Both Rails
- Output Swings Rail-to-Rail
- Low Broadband Voltage Noise: $2.75nV/\sqrt{Hz}$
- Fast Output Recovery
- Supply Voltage Range: 2.5V to 5.25V
- Input Offset Voltage: 350µV Max
- Large Output Current: 90mA
- CMRR: 105dB
- Open Loop Gain: 60V/mV
- Operating Temperature Range: –40°C to 125°C
- MS10 Package with Independent Shutdown Pins

APPLICATIONS

- Low Voltage, High Frequency Signal Processing
- Driving A/D Converters
- Rail-to-Rail Buffer Amplifiers
- Active Filters
- Battery Powered Equipment

DESCRIPTION

The LTC®6253-7 is a dual high speed, low power, rail-to-rail input/output operational amplifier. On only 3.5mA of supply current, it features a 2GHz gain-bandwidth product, 500V/µs slew rate and a low $2.75nV/\sqrt{Hz}$ of input-referred noise. The combination of high bandwidth, high slew rate, low power consumption and low broadband noise makes the LTC6253-7 ideal for lower supply voltage, high speed signal conditioning systems. The device is stable for closed loop noise gains of 7 or higher.

The LTC6253-7 maintains high efficiency performance from supply voltage levels of 2.5V to 5.25V and is fully specified at supplies of 2.7V and 5.0V.

For applications that require power-down, the LTC6253-7 offers a shutdown pin which disables the amplifier and reduces current consumption to 42µA.

The LTC6253-7 can be used as a plug-in replacement for many commercially available op amps to reduce power or to improve input/output range and performance.

*LT, LT, LTC, LTM, Linear Technology and the Linear logo are registered trademarks of Linear Technology Corporation. All other trademarks are the property of their respective owners.*

TYPICAL APPLICATION

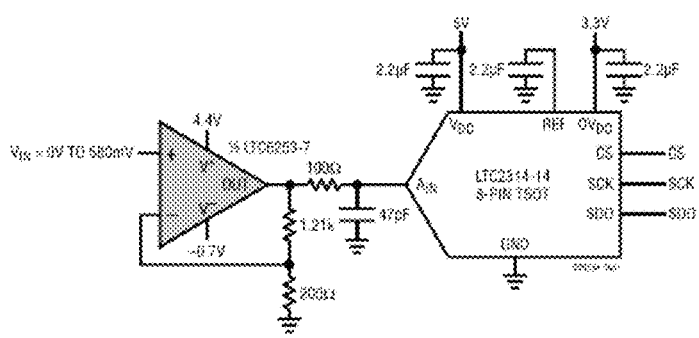

ADC Driver with Gain

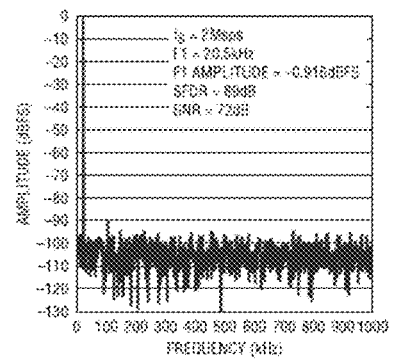

LTC6253-7 Driving LTC2314-14 1024 Point FFT

FIG 9 – Analog Devices LTC6253-7 Datasheet (Page 1)

LTC6253-7
TYPICAL PERFORMANCE CHARACTERISTICS
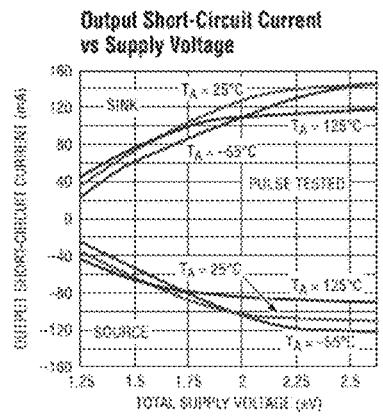
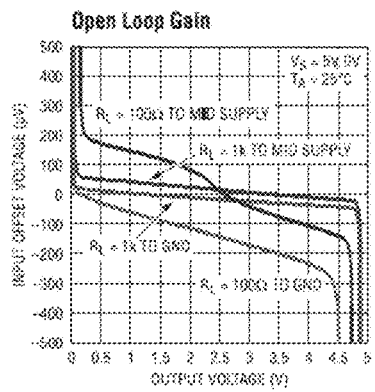
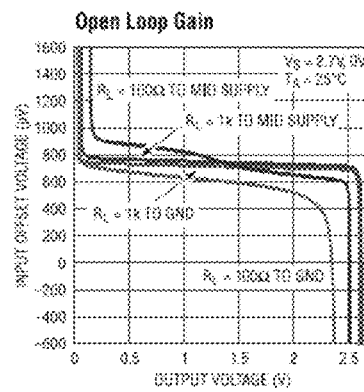
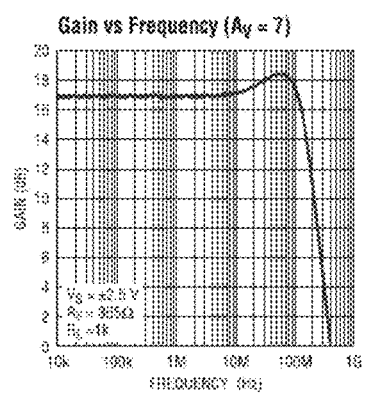
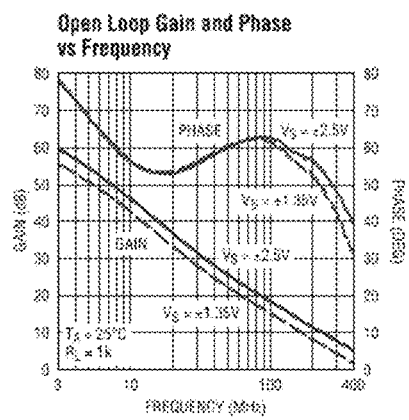
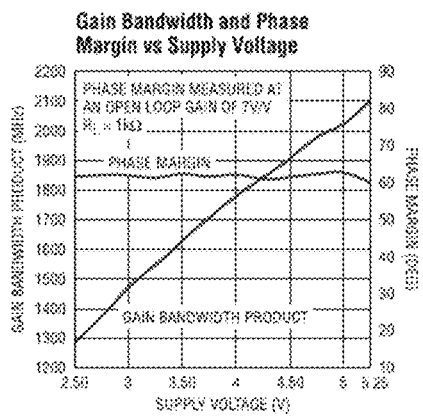
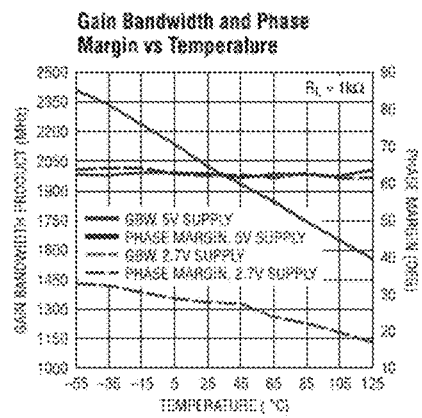
FIG 10 – Analog Devices LTC6253-7 Datasheet (Page 9)

 HMC589AST89E
v03.0121

InGaP HBT GAIN BLOCK MMIC AMPLIFIER, DC - 4 GHz

Typical Applications

The HMC589AST89E is ideal for:
- Cellular / PCS / 3G
- Fixed Wireless & WLAN
- CATV, Cable Modem & DBS
- Microwave Radio & Test Equipment
- IF & RF Applications

Features

P1dB Output Power: +21 dBm
Gain: 21 dB
Output IP3: +33 dBm
Single Supply: +5V
Industry Standard SOT89E Package

Functional Diagram

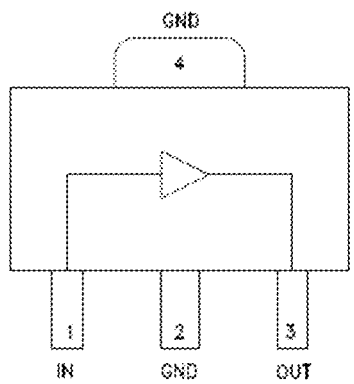

General Description

The HMC589AST89E is an InGaP HBT Gain Block MMIC SMT amplifier covering DC to 4 GHz and packaged in an industry standard SOT89E. The amplifier can be used as a cascadable 50 Ohm RF or IF gain stage as well as a LO or PA driver with up to +19 dBm P1dB output power for cellular/3G, FWA, CATV, microwave radio and test equipment applications. The HMC589AST89E offers 20 dB gain and +33 dBm output IP3 at 1 GHz while requiring only 82 mA from a single positive supply. The HMC589AST89E InGaP HBT gain block offers excellent output power and gain stability over temperature.

Electrical Specifications, Vs= 5V, Rbias= 1.8 Ohm, $T_A$ = +25° C

| Parameter | | Min. | Typ. | Max. | Units |
|---|---|---|---|---|---|
| Gain | DC - 1.0 GHz | 19 | 21 | | dB |
| | 1.0 - 2.0 GHz | 18 | 19 | | dB |
| | 2.0 - 3.0 GHz | 14 | 17 | | dB |
| | 3.0 - 4.0 GHz | 13 | 15 | | dB |
| Gain Variation Over Temperature | DC - 5 GHz | | 0.008 | | dB/°C |
| Input Return Loss | DC - 1.0 GHz | | 17 | | dB |
| | 1.0 - 4.0 GHz | | 15 | | dB |
| Output Return Loss | DC - 1.0 GHz | | 12 | | dB |
| | 1.0 - 4.0 GHz | | 8 | | dB |
| Reverse Isolation | DC - 4 GHz | | 23 | | dB |
| Output Power for 1 dB Compression (P1dB) | 0.5 - 1.0 GHz | 17.5 | 19 | | dBm |
| | 1.0 - 2.0 GHz | 16 | 19 | | dBm |
| | 2.0 - 3.0 GHz | 16 | 19 | | dBm |
| | 3.0 - 4.0 GHz | 14.5 | 18 | | dBm |
| Output Third Order Intercept (IP3) (Pout= 0 dBm per tone, 1 MHz spacing) | 0.5 - 1.0 GHz | | 33 | | dBm |
| | 1.0 - 2.0 GHz | | 32 | | dBm |
| | 2.0 - 3.0 GHz | | 31.5 | | dBm |
| | 3.0 - 4.0 GHz | | 29 | | dBm |
| Noise Figure | DC - 2.0 GHz | | 4.0 | | dB |
| | 2.0 - 4.0 GHz | | 4.5 | | dB |
| Supply Current (Icq) | | | 82 | 102 | mA |

FIG 11 – Analog Devices HMC589AST89E Datasheet (Page 1)

DUAL MODE RF-IF AMP

BACKGROUND OF THE INVENTION

1. Field of the Invention

This invention relates to the field of Radio Frequency (RF) and Intermediate Frequency (IF) amplifier circuit topology. More specifically, this invention relates to the usage of a single common gain amplifier block to provide amplification for both RF and IF components of a receiver front end circuit. The usage of a single gain block for both frequency components can offer a substantial power reduction in the design of a receiver. One other aspect of the invention is the ability to construct a transmitter based on the same principle by a simple rearrangement of components.

2. Description of the Related Art

There are many commonly known discrete and integrated circuit device configurations found within the receiver front end circuit design field. All of these configurations are based on utilization of different amplification gain stages to amplify either the RF or IF components comprising a receiver front end. One of the first introduced commercially available integrated circuit implementations was the NE602 and NE604 devices used to provide a FM radio front end. Follow on designs from multiple manufactures, provided a higher integration level but still maintained separation of the RF and IF gain block amplification sections.

In recent years, a focus of design implementation has been to reduce the power consumption used in receiver front end circuitry. Because super heterodyne receiver circuits contain gain stages at both the RF and IF components, power consumption is required for both these separate circuit elements. The present invention utilizes a single common gain block amplifier circuit for both the RF and IF components resulting in reduced power consumption. This power consumption efficiency improvement is made possible by the fact RF/video gain circuits typically have associated gain down to a direct current (DC) operating point. This available wide range of gain allows the same amplifier element to be utilized at both the RF and IF operating points within a typical receiver front end circuit.

BRIEF SUMMARY OF THE INVENTION

The present invention comprises a dual mode RF-IF amplifier common gain block for use within a receiver front end or transmitter circuit. Separation of the RF-IF components at the gain block input and output is achieved by usage of frequency selective filtering. The RF component is isolated using a high pass filter and the IF component is selected by a low pass filter. Overall, the circuit topology serves to break the dual mode gain block signal paths separately into high pass and low pass routes. The RF signal passes thru the high pass route while the IF signal is processed by the low pass route. For a receiver, output of the RF high pass amplification route is sourced into a down conversion mixer which creates the IF signal as input to the low pass amplification route. A transmitter essentially reverses this signal flow using the mixer to up convert the IF signal in an RF signal whereby both frequencies are amplified in a similar manner.

The invention can encompass multiple embodiments depending on performance or implementation goals. Within this specification the terms "gain block" and "amplifier" are used interchangeably.

BRIEF DESCRIPTION OF THE DRAWINGS

FIG. 1 is a system block diagram showing the various components of the present invention.

FIG. 2 is a schematic view showing the electrical blocks and signal flow between blocks to implement an example integrated circuit design.

FIG. 3 is electrical simulation (SPICE) modeling showing time domain operation of the schematic circuit from FIG. 2.

FIG. 4 is electrical simulation (SPICE) modeling showing frequency domain operation of the schematic circuit from FIG. 2.

FIG. 5 is a schematic view showing the electrical blocks and signal flow between blocks to implement an example discrete component PCB based design.

FIG. 6 is electrical simulation (SPICE) modeling showing time domain operation of the schematic circuit from FIG. 5.

FIG. 7 is electrical simulation (SPICE) modeling showing frequency domain operation of the schematic circuit from FIG. 5.

FIG. 8 is a system block diagram for a transmitter type alternate embodiment

FIG. 9 is page one of the datasheet for Analog Devices LTC6253-7 amplifier device.

FIG. 10 is page nine of the datasheet for Analog Devices LTC6253-7 amplifier device.

FIG. 11 is page one of the datasheet for Analog Devices HMC589AST89E gain block device.

REFERENCE NUMERALS IN THE DRAWINGS

| | | | |
|---|---|---|---|
| 100 | High Pass RF Input Filter | 102 | Dual Mode Gain Block |
| 104 | High Pass RF Output Filter | 106 | Mixer Element |
| 108 | Low Pass IF Input Filter | 110 | Low Pass IF Output Filter |
| 112 | RF Gain Path | 114 | IF Gain Path |
| 200 | High/Low Pass Input Filter | 202 | Dual Mode Gain Block |
| 204 | High/Low Pass Output Filter | 206 | Mixer Element |
| 500 | High/Low Pass Input Filter | 502 | Dual Mode Gain Block |
| 504 | High/Low Pass Output Filter | 506 | Mixer Element |
| 800 | High Pass RF Input Filter | 802 | Dual Mode Gain Block |
| 804 | High Pass RF Output Filter | 806 | Mixer Element |
| 808 | Low Pass IF Input Filter | 810 | Low Pass IF Output Filter |
| 812 | RF Gain Path | 814 | IF Gain Path |

DETAILED DESCRIPTION OF THE INVENTION

The present invention is detailed in system block diagram FIG. 1 showing functional components and signal interconnects. Input signal RF_IN is produced typically by an antenna or LNA and sourced to the RF Input Filter block 100. This filter block provides isolation between the higher frequency RF signal and lower frequency IF signal. Filter block 100 routes the RF signal into gain block 102. The RF signal is then amplified by gain block 102 and accepted by high pass output filter 104. The lower frequency IF signal is rejected by high pass output filter 104. Mixer block 106 performs frequency down conversion of the RF signal to IF signal based on the multiplication of RF signal input and LO_IN signal. The mixer block 106 can be implemented using any typical mixer configuration, for example single or double balanced, commonly found in receiver circuit design. Mixer block 106 output is sourced to the IF mixer low pass input filter 108 in order to route the IF signal into gain block 102. The IF signal is amplified by gain block 102 and sourced to IF output filter block 110 to select the lower frequency IF signal. The higher frequency RF signal is rejected by filter block 110 thereby allowing only the IF signal to be sourced to receiver output signal IF_OUT. The IF_OUT signal would be typically sourced for example to a demodulation or discriminator type circuit as part of the receiver design. The RF signal (high frequency) gain path 112 is depicted to consist of RF input filter 100, gain block 102 and mixer input filter block 104. The IF signal (low frequency) gain path 114 is depicted to consist of mixer output filter block 108, gain block 102 and IF output filter 110. The invention uniquely configures gain block 102 as common to both the RF gain path and IF gain path as shown in FIG. 1.

The preferred embodiment of the invention is shown in FIG. 2 as example of an integrated circuit type implementation. This preferred embodiment utilizes input and output filter elements based on resistor-capacitor type components suitable for an integrated circuit. FIG. 2 shows an electrical simulation schematic used by the LTSpice computer program for characterizing performance of the invention circuitry. Following, is a detailed description of the schematic. Voltage source V1 provides a 100 MHz input sine wave signal applied as input. Input filter 200 combines the higher frequency RF signal path with the lower frequency IF signal path as input to gain block 202. The RF signal is amplified by gain block 202 and separation of the RF and IF frequency paths is performed by output filter 204. The amplified RF signal is routed to mixer 206 for down conversion to the IF frequency of 100 KHz. Voltage source V2 provides the LO frequency of 99.9 MHz as input to mixer 206. Mixer 206 outputs the IF signal into input filter 200 for further amplification by gain block 202. Gain block 202, as common with most amplifiers, provides voltage gain from the GBW (gain bandwidth) point down to or near the DC operating point. Therefore, any type amplifier circuit capable of providing suitable voltage gain above the RF component and below the IF component be used within the present invention. Linearity of the amplifier is important to minimize any self mixing of the RF and IF signal components. After amplification of the IF signal by gain block 202, the output filter 204 routes the final IF signal to the output port. FIG. 3 shows the electrical time domain simulation of the RF input and IF output signals. The input RF signal has amplitude of 1 mV whereby the output IF signal is shown to be 320 mV giving a voltage gain of 50 dB. FIG. 4 shows the frequency domain components of the IF output signal giving a spurious free range of greater than 50 dB. Circuit performance can be further improved by optimization of component values for the specific implementation.

The FIG. 2 and FIG. 5 example schematic representations for input filters 200 500 and output filters 204 504 utilize a simple lead/lag filter topology; however any filter configuration providing high and low frequency separation to a common port can be used. These example schematics, as drawn using single ended signals, readily support differential signaling commonly used in RF and IF receiver circuits although not explicitly shown. Further, gain blocks 202 502 shown as a single stage can consist of cascaded stages to achieve the necessary voltage gain. Mixer element is represented by an analytically modeled voltage source whereby any mixer configuration capable of frequency down conversion can be used.

An alternate embodiment of the invention is shown in FIG. 5 as an example of a discrete component circuit utilizing inductor-capacitor filter elements suitable for PCB construction. As before, FIG. 5 shows an electrical simulation schematic used by the LTSpice computer program for characterizing performance of the invention circuitry. Following, is a detailed description of the schematic. Voltage source V1 provides a 10 MHz input sine wave signal applied as input. Input filter 500 combines the higher frequency RF signal path with the lower frequency IF signal path as input to gain block 502. The RF signal is amplified by gain block 502 and separation of the RF and IF frequency paths are performed by output filter 504. The amplified RF signal is routed to mixer 506 for down conversion to the IF frequency of 100 KHz. Voltage source V2 provides the LO frequency of 9.9 MHz as input to mixer 506. Mixer 506 outputs the IF signal into input filter 500 for further amplification by gain block 502. Gain block 502 in this embodiment could be implemented using an Analog Devices LTC6253-7 device capable of providing voltage gain above the RF component and below the IF component. FIG. 8 shows page one of the device datasheet indicating a stable 17 dB gain provided over the DC-100 MHz bandwidth region. FIG. 9 shows page nine of the device datasheet detailing performance graph for gain versus frequency over the DC-100 MHz frequency band. After amplification of the IF signal by gain block 502, the output filter 504 routes the final IF signal to the output port. FIG. 6 shows the electrical time domain simulation of the RF input and IF output signals. The input RF signal has amplitude of 1 mV whereby the output IF signal is shown to be 160 mV giving a voltage gain of 45 dB. FIG. 7 shows the frequency domain components of the IF output signal giving a spurious free range of greater than 60 dB. Circuit performance can be further improved by optimization of component values for the specific implementation. Operating frequency range of the system can be easily increased by adjusting the input and output component values allowing usage of a 50 ohm gain block. These devices typically have usable gain up into the microwave frequency band but suffer from a higher current consumption.

An alternate embodiment could be configured to add an additional filter at the IF output port to further improve the spurious free range performance.

Another alternate embodiment could be configured to add an additional gain block at the IF output port. The gain block can be configured to provide additional signal gain or low impedance load drive for the IF signal.

Another alternate embodiment could be configured to add an additional filter element between mixer 106 and input filter 108 to reduce mixer output products.

Another alternate embodiment is configured to include a low noise amplifier stage prior to the RF input port. This embodiment is intended to improve the overall noise figure performance of the receiver.

One further alternate embodiment for the present invention is shown in FIG. 8 describing an example transmitter implementation. The transmitter performs frequency up conversion from IF to RF components in addition to signal amplification of both components using a common gain block. Description of this embodiment closely follows the discussion of FIG. 1 receiver block diagram however the functional blocks are interchanged. The lower frequency IF signal is routed through input filter 808 into gain block 802 where it is amplified. The amplified IF signal is then selected by output filter 810 and input to mixer 806 for up conversion with LO_IN to the RF component. This mixer generated RF component is routed by input filter 800 into gain block 802 where it is amplified. The amplified RF signal is then selected by output filter 804 as the RF_OUT output signal. As discussed before, a transmitter would typically utilize a 50 ohm gain block offering increased frequency range and output power. FIG. 11 shows page one of the device datasheet detailing performance capabilities of 16 dB gain from DC-4 GHz frequency range, output power of +21 dBm and output compression point of +33 dBm. The device usage is also stated for "IF & RF Applications".

Having described my invention, I claim:

1. A receiver front end system comprising:
   a. a high pass frequency selective input filter;
   b. a low pass frequency selective input filter;
   c. the input filter output port coupled to both high pass and low pass input ports;
   d. a gain block configured to provide amplification means;
   e. the gain block input coupled to the input filter output port;
   f. a high pass frequency selective output filter;
   g. a low pass frequency selective output filter;
   h. the output filter input port coupled to both high pass and low pass output ports;
   i. the gain block output coupled to the output filter input port;
   j. a mixer block configured to provide frequency down conversion means;
   k. the mixer coupled to both the output filter high pass output port and the input filter low pass input port.

2. A receiver front end as recited in claim 1, further comprising a low noise amplifier stage coupled prior to the input.

3. A receiver front end as recited in claim 1, further comprising an additional frequency selective filter coupled to the output.

4. A receiver front end as recited in claim 1, further comprising an additional gain block coupled to the output.

5. A method for using a common amplification stage to amplify both the RF and IF components of a receiver front end, the method comprising:
   a. filtering a RF input signal using a high pass frequency selective input filter;
   b. filtering a mixer generated IF component signal using a low pass frequency selective input filter;
   c. combining the filtered RF input signal and the filtered mixer generated IF input signal within the input filter;
   d. amplifying the input filter combined signals with a common amplifier stage;
   e. selecting the amplified RF signal component using a high pass frequency selective output filter;
   f. selecting the amplified IF signal component using a low pass frequency selective output filter;
   g. down converting the selected amplified RF signal component to produce an IF component using a mixer;
   h. feeding back the mixer generated IF component into the low pass input filter.

6. The method of claim 5, further comprising amplification of the RF input by a low noise amplifier.

7. The method of claim 5, further comprising filtering by an additional frequency selective filter coupled to the output.

8. The method of claim 5, further comprising amplification by an additional gain block coupled to the output.

9. A transmitter system comprising:
   a. a high pass frequency selective input filter;
   b. a low pass frequency selective input filter;
   c. the input filter output port coupled to both high pass and low pass input ports;
   d. a gain block configured to provide amplification means;
   e. the gain block input coupled to the input filter output port;
   f. a high pass frequency selective output filter;
   g. a low pass frequency selective output filter;
   h. the output filter input port coupled to both high pass and low pass output ports;
   i. the gain block output coupled to the output filter input port;
   j. a mixer block configured to provide frequency up conversion means;
   k. the mixer coupled to both the output filter low pass output port and the input filter high pass input port.

10. A transmitter as recited in claim 9, further comprising an additional frequency selective filter coupled to the output.

11. A transmitter as recited in claim 9, further comprising an additional gain block coupled to the output.

\* \* \* \* \*